(12) United States Patent
Taylor et al.

(10) Patent No.: US 7,973,527 B2
(45) Date of Patent: *Jul. 5, 2011

(54) ELECTRONIC CIRCUIT CONFIGURED TO RESET A MAGNETORESISTANCE ELEMENT

(75) Inventors: William P. Taylor, Amherst, NH (US); Michael C. Doogue, Manchester, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 264 days.

This patent is subject to a terminal disclaimer.

(21) Appl. No.: 12/183,541

(22) Filed: Jul. 31, 2008

(65) Prior Publication Data

US 2010/0026289 A1   Feb. 4, 2010

(51) Int. Cl.
*G01R 15/18* (2006.01)
(52) U.S. Cl. ............................................ 324/117 R
(58) Field of Classification Search ................ None
See application file for complete search history.

(56) References Cited

U.S. PATENT DOCUMENTS

| | | | |
|---|---|---|---|
| 4,385,283 A * | 5/1983 | Delapierre | 324/503 |
| 5,247,278 A | 9/1993 | Pant et al. | |
| 5,521,501 A | 5/1996 | Dettmann et al. | |
| 5,561,366 A | 10/1996 | Takahashi et al. | |
| 5,686,838 A | 11/1997 | Van den Berg | |
| 5,831,426 A | 11/1998 | Black, Jr. et al. | |
| 6,071,655 A | 6/2000 | Faulconer | |
| 6,094,330 A | 7/2000 | Criniti et al. | |
| 6,316,931 B1 | 11/2001 | Nakagawa et al. | |
| 6,323,634 B1 | 11/2001 | Nakagawa et al. | |
| 6,411,078 B1 | 6/2002 | Nakagawa et al. | |
| 6,424,018 B1 | 7/2002 | Ohtsuka | |
| 6,429,640 B1 | 8/2002 | Daughton et al. | |
| 6,433,981 B1 | 8/2002 | Fletcher et al. | |
| 6,445,171 B2 | 9/2002 | Sandquist et al. | |
| 6,462,531 B1 | 10/2002 | Ohtsuka | |
| 6,544,078 B2 | 4/2003 | Palmisano et al. | |
| 6,566,856 B2 | 5/2003 | Sandquist et al. | |
| 6,642,705 B2 | 11/2003 | Kawase | |
| 6,667,682 B2 | 12/2003 | Wan et al. | |
| 6,683,448 B1 | 1/2004 | Ohtsuka | |
| 6,759,841 B2 | 7/2004 | Goto et al. | |

(Continued)

FOREIGN PATENT DOCUMENTS

DE     10017374 B4   12/2000

(Continued)

OTHER PUBLICATIONS

Sauber et al.; U.S. Appl. No. 12/183,106, filed Jul. 31, 2008.

(Continued)

*Primary Examiner* — Jermele M Hollington
(74) *Attorney, Agent, or Firm* — Daly, Crowley, Mofford & Durkee, LLP (57) ABSTRACT

An electronic circuit includes a magnetoresistance element for providing an output signal proportional to a magnetic field. The magnetoresistance element also has a hysteresis characteristic. The electronic circuit also includes at least one of a reset conductor or a bias conductor disposed proximate to the magnetoresistance element. For embodiments having a reset conductor, the electronic circuit is configured to generate a reset current carried by the reset conductor in response to the comparison. In response to the reset current, the reset conductor is configured to generate a reset magnetic field at the magnetoresistance element to temporarily force the magnetoresistance element to a saturation region of the hysteresis characteristic.

24 Claims, 8 Drawing Sheets

U.S. PATENT DOCUMENTS

| | | | |
|---|---|---|---|
| 6,791,313 B2 | 9/2004 | Ohtsuka | |
| 6,812,687 B1 | 11/2004 | Ohtsuka | |
| 6,841,989 B2 | 1/2005 | Goto et al. | |
| 6,970,333 B2 | 11/2005 | Boeve | |
| 6,989,665 B2 | 1/2006 | Goto | |
| 7,248,045 B2 | 7/2007 | Shoji | |
| 7,336,064 B2 | 2/2008 | Ludwig et al. | |
| 7,495,624 B2 | 2/2009 | Daalmans | |
| 2002/0180431 A1* | 12/2002 | Torok et al. | 324/252 |
| 2006/0071655 A1 | 4/2006 | Shohi | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0170529 A1 | 8/2006 | Shoji | |
| 2006/0291106 A1 | 12/2006 | Shoji | |
| 2007/0044370 A1 | 3/2007 | Shoji | |
| 2007/0076332 A1 | 4/2007 | Shoji et al. | |
| 2007/0090825 A1 | 4/2007 | Shoji | |
| 2007/0096716 A1 | 5/2007 | Shoji | |
| 2007/0188946 A1 | 8/2007 | Shoji | |
| 2009/0212765 A1* | 8/2009 | Doogue et al. | 324/202 |
| 2009/0315543 A1 | 12/2009 | Guo et al. | |
| 2010/0001715 A1* | 1/2010 | Doogue et al. | 324/117 H |
| 2010/0026288 A1* | 2/2010 | Sauber et al. | 324/252 |

FOREIGN PATENT DOCUMENTS

| | | |
|---|---|---|
| DE | 10159607 A1 | 9/2002 |
| DE | 10128150 C1 | 1/2003 |
| DE | 10155423 B4 | 5/2003 |
| DE | 10202287 C1 | 8/2003 |
| DE | 10222395 A1 | 12/2003 |
| DE | 102004003369 A1 | 8/2005 |
| DE | 102004009267 B3 | 9/2005 |
| DE | 102004038847 B3 | 9/2005 |
| DE | 102004040079 B3 | 12/2005 |
| DE | 102005037905 A1 | 3/2006 |
| DE | 102004053551 A1 | 5/2006 |
| DE | 102006008257 A1 | 10/2006 |
| DE | 102006021774 A1 | 1/2007 |
| DE | 102005038655 B3 | 3/2007 |
| DE | 102005040539 B4 | 3/2007 |
| DE | 10 2005 037 036 A1 | 4/2007 |
| DE | 10 2005 037 036 B4 | 4/2007 |
| DE | 102005052688 A1 | 5/2007 |
| DE | 102006007770 A1 | 8/2007 |
| DE | 102006028698 B3 | 12/2007 |
| DE | 102006046736 B4 | 4/2008 |
| DE | 102006046739 B4 | 8/2008 |
| WO | WO 2006/136577 A1 | 12/2006 |
| WO | WO 2007/147760 A2 | 12/2007 |

OTHER PUBLICATIONS

Taylor et al.; "A Spin-Valve Based SOIC8 Current Sensor;" Allegro MicroSystems, Inc. Manuscript; Revised Aug. 17, 2006; pp. 1-4.

Yamada et al.; "Eddy-Current Testing Probe with Spin-Valve Type GMR Sensor for Printed Circuit Board Inspection;" IEEE Transactions on Magnetics; vol. 40; Jul. 2004; pp. 2676-2678.

Office Action dated Mar. 18, 2011 for U.S. Appl. No. 12/183,106.

\* cited by examiner

*FIG. 7*

ELECTRONIC CIRCUIT CONFIGURED TO RESET A MAGNETORESISTANCE ELEMENT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to circuits that use magnetoresistance elements and, more particularly, to a circuit configured to reset a magnetoresistance element to establish operation on a known portion of a hysteresis characteristic.

BACKGROUND OF THE INVENTION

As is known, there are a variety of types of magnetic field sensing elements, including, but not limited to, Hall effect elements, magnetoresistance elements, and magnetotransistors. As is also known, there are different types of Hall effect elements, for example, a planar Hall element, and a vertical Hall element. As is also known, there are different types of magnetoresistance elements, for example, a giant magnetoresistance (GMR) element, an anisotropic magnetoresistance element (AMR), a tunneling magnetoresistance (TMR) element, and a magnetic tunnel junction (MTJ).

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetoresistance elements tend to have a hysteresis characteristic with regard to resistance versus applied magnetic field. Different types of magnetoresistance elements can have different hysteresis characteristics, some of which are described below.

The hysteresis characteristic can result in an uncertainty as to a magnetic field being sensed by the magnetoresistance element. In other words, at different times, the magnetoresistance element can have two different resistances when exposed to the same external magnetic field.

Magnetic field sensors, i.e., circuits that use magnetic field sensing elements, are used in a variety of applications, including, but not limited to, a current sensor that senses a magnetic field generated by a current flowing in a current-carrying conductor, a magnetic switch that senses the proximity of a ferromagnetic object, a rotation detector that senses passing ferromagnetic articles, for example magnetic domains of a ring magnet, and a magnetic field sensor that senses a magnetic field density of a magnetic field.

As is known in the art, a conventional magnetic field sensor, e.g., a current sensor, can be arranged in either an open loop or a closed loop configuration. An "open loop" current sensor includes a magnetic field sensing element in proximity to a current-carrying, or primary, conductor. The current sensor provides an output signal proportional to the magnetic field generated by current passing through the primary conductor.

A "closed loop" current sensor additionally includes a secondary conductor in proximity to the magnetic field sensing element. A current is passed through the secondary conductor in order to generate a magnetic field that opposes and cancels the magnetic field generated by a current passing through the primary conductor. Thus, the magnetic field in the vicinity of the magnetic field sensing element is substantially zero. The current passed through the secondary conductor is proportional to the magnetic field in the primary conductor and thus, to the primary current. The closed loop configuration generally provides improved accuracy over the open loop configuration. This is because the effect of the above-described hysteresis characteristic associated with the magnetic field sensing element, and in particular, associated with a magnetoresistance element, is eliminated in many situations by maintaining the magnetic field on the magnetic field sensing element to be approximately zero. The closed loop configuration also generally provides improved linearity in comparison with the open loop configuration, as well as increased dynamic range.

Though the closed loop arrangement can eliminate the effect of the hysteresis characteristic in many situations, the closed loop arrangement is unable to eliminate the effect of the hysteresis characteristic in some situations. For example, if the magnetic field experienced by the magnetic field sensing element is very large, and large enough that the closed loop arrangement is unable to fully oppose the magnetic field generated by current carried by the primary conductor, then the magnetic field sensing element, and in particular, the magnetoresistance element, may saturate, and the hysteresis characteristic may thereafter result in the above-described uncertainty of the sensed magnetic field.

Furthermore, the above-described closed loop arrangement includes circuit components, for example, amplifiers, which have delay times. Therefore, due to the time delay, a rapid transient in the magnetic field experience by the magnetic field sensing element may not be fully opposed by the feedback circuit. Thus, in this situation also, the magnetic field sensing element, and in particular, the magnetoresistance element, may saturate, and the hysteresis characteristic may thereafter result in the above-described uncertainty of the sensed magnetic field.

Various parameters characterize the performance of magnetic field sensors, e.g., current sensors, including sensitivity and linearity. Sensitivity is related to a change in the resistance of the magnetoresistance element or the change in output voltage from the Hall effect element in response to a change in magnetic field. Linearity is related to the degree to which the resistance of the magnetoresistance element or the output voltage from the Hall effect element varies in direct proportion to the magnetic field.

In general, it is known that many types of magnetoresistance elements have a greater sensitivity than a Hall effect element. However, it is also known that many types of magnetoresistance elements have a hysteresis characteristic that can result in a greater uncertainty in a sensed magnetic field than a Hall effect element.

It would be desirable to provide a sensor (e.g., a current sensor) using a magnetoresistance element, and therefore, capable of a relatively high sensitivity, but for which the uncertainty of the sensed magnetic field (e.g., of the sensed current) due to a hysteresis characteristic is reduced.

While current sensors using magnetoresistance elements are described as examples above, it will be appreciated that conventional external magnetic field sensors and also conventional electrical signal isolators that use magnetoresistance elements suffer from the same disadvantages due to the hysteresis characteristic. It would, therefore, also be desirable to provide an external magnetic field sensor and also an electrical signal isolator using a respective magnetoresistance element, and therefore, capable of a relatively high sensitivity, but for which the uncertainty of the sensed magnetic field due to a hysteresis characteristic is reduced.

SUMMARY OF THE INVENTION

The present invention provides a sensor using a magnetoresistance element, and for which an uncertainty of the sensed magnetic field due to a hysteresis characteristic is reduced.

In accordance with one aspect of the present invention, an electronic circuit includes a magnetoresistance element for providing an output signal proportional to a magnetic field. The magnetoresistance element has a maximum response axis. The magnetoresistance element also has a hysteresis characteristic. The electronic circuit also includes a reset conductor disposed proximate to the magnetoresistance element. The electronic circuit also includes a comparison circuit coupled to receive the output signal, configured to compare the output signal to a threshold signal, and configured to generate a reset current carried by the reset conductor in response to the comparison. In response to the reset current, the reset conductor is configured to generate a reset magnetic field at the magnetoresistance element to temporarily force the magnetoresistance element to a saturation region of the hysteresis characteristic.

In accordance with another aspect of the present invention, an electronic circuit includes a magnetoresistance element for providing an output signal proportional to a magnetic field. The magnetoresistance element has a maximum response axis. The magnetoresistance element also has a hysteresis characteristic. The electronic circuit also includes a first bias magnetic field generating module. The first bias magnetic field generating module is configured to continuously generate a first bias magnetic field at the magnetoresistance to continually force the magnetoresistance element to a transition region of the hysteresis characteristic in the absence of any other magnetic field.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "magnetic field sensing element" is used to describe a variety of electronic elements that can sense a magnetic field. While magnetic field sensing elements are shown and described below to be magnetoresistance elements, in other arrangements, the magnetic field sensing elements can be, but are not limited to, Hall effect elements or magnetotransistors. As is known, there are different types of Hall effect elements, for example, a planar Hall element, and a vertical Hall element. As is also known, there are different types of magnetoresistance elements, for example, a giant magnetoresistance (GMR) element, an anisotropic magnetoresistance element (AMR), a tunneling magnetoresistance (TMR) element, and a magnetic tunnel junction (MTJ).

As used herein, the term "magnetic field sensor" is used to describe a circuit that includes a magnetic field sensing element. Magnetic field sensors are used in a variety of applications, including, but not limited to, a current sensor that senses a magnetic field generated by a current flowing in a current conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Figure 1:
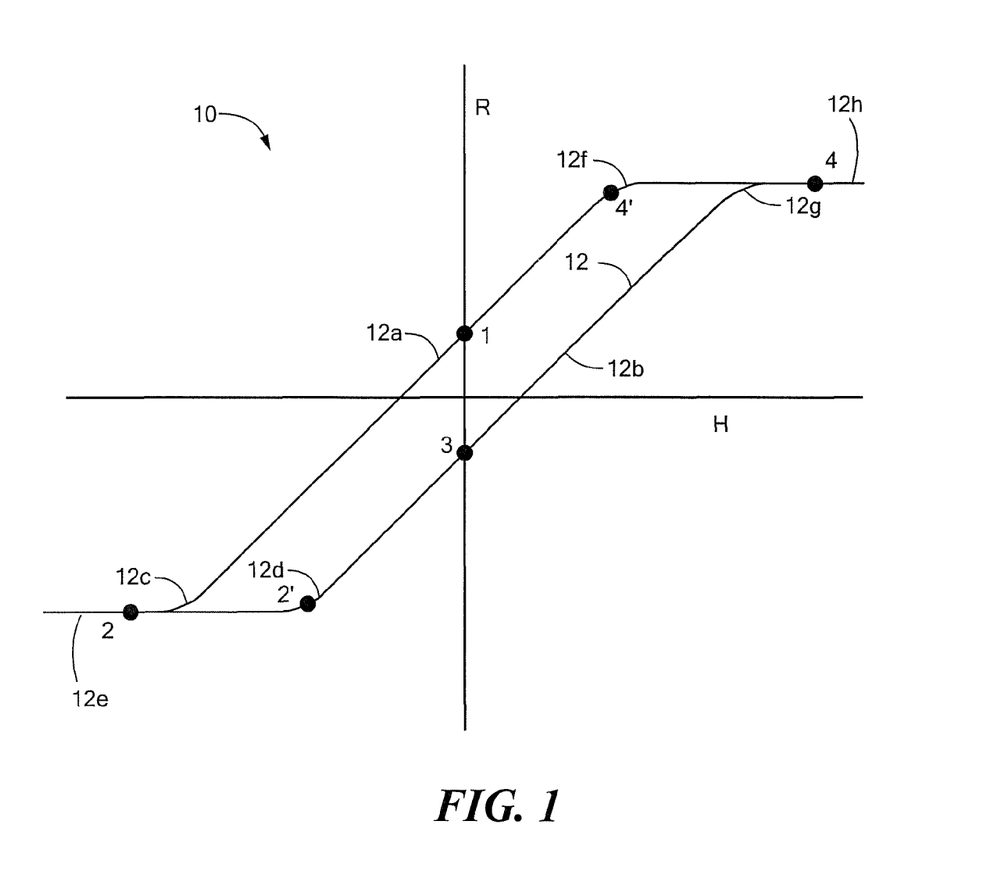
FIG. 1 is a graph showing an exemplary hysteresis characteristic associated with one type of magnetoresistance element.

Referring now to FIG. 1, a graph 10 has a horizontal axis with units of applied magnetic field, or H, which may be provided, for example, in units of Oersteds, and a vertical axis with a scale in units of resistance, or R, which may be provided, for example, in units of Ohms. A curve 12 is representative of a hysteresis characteristic of some types of magnetoresistance elements, for example, giant magnetoresistance elements, for example, a linear spin valve.

The curve 12 has relatively flat saturation regions 12e, 12h, in which the magnetoresistance element associated with the curve 12 experiences high magnetic fields, and relatively straight linear regions 12a, 12b separated from the saturation regions 12e, 12h by transition regions 12c, 12d, 12f, 12g.

As used herein, one end of a transition region, for example, the transition region 12c, occurs at a point at which the transition region 12c has a slope that deviates from the average slope of a saturation region with which is it associated, for example, the saturation region 12e, by about five percent. Also as used herein, the other end of the transition region, for example the transition region 12c, occurs at a point at which the transition region 12c has a slope that deviates from the average slope of a linear region with which it is associated, for example, the linear region 12a, by about five percent. Points 2' and 4' are at ends of transition regions 12d, 12f, respectively. While ends of the transition regions are described above as deviations from the linear and saturation regions by about five percent, the transition regions can also be determined according to other percentages greater than or less than five percent.

When the magnetoresistance element associated with the curve 12 experiences a nominal (or zero) magnetic field, for example, at the crossing of the two axes, the resistance of the magnetoresistance element can be a resistance represented by either point 1 or point 3. Presuming that the resistance is represented by the point 1, if the magnetic field increases to the right, the magnetoresistance element will achieve a resistance represented by a point 4. If the magnetic field is decreased thereafter to the left, the magnetoresistance element will again achieve the resistance represented by the point 1.

If the magnetic field is increased in the other direction, to the left, (or decreases further for the case when the crossing of the axes is not at zero magnetic field) the magnetoresistance element will achieve a resistance represented by a point 2. If the magnetic field is increased thereafter to the right, the magnetoresistance element will achieve a resistance represented by the point 3, and not by the point 1. Thus, at a magnetic field represented by the points 1 and 3 (or at other points), there is an uncertainty as to the magnetic field being experienced by the magnetoresistance element. In particular, two different resistances, for example, those represented by points 1 and 3, are both indicative of the same magnetic field.

It will be recognized that if the magnetic field is increased to the right further, the magnetoresistance element will again achieve a resistance represented by the point 4. From the point 4, if the magnetic field is decreased to the left, the magnetoresistance element will achieve a resistance represented by the point 1. Thus, it will be appreciated that the curve 12 is traversed in a counter clockwise direction.

In view of the above discussion, it will be apparent that, if the magnetoresistance element achieves a resistance represented by either the point 2 or the point 4, it is deterministic on which one of the two linear regions 12a or 12b the magnetoresistance element will thereafter operate. Therefore, in discussion below, the term "reset" is used to describe a forcing of the magnetoresistance element to achieve either a resistance represented by the point 2 or by the point 4 by application of a reset magnetic field to the magnetoresistance element in one direction or the other, generally along a maximum response axis of the magnetoresistance element.

If operation on the linear region 12a is desired, then the reset forces the magnetoresistance element to a resistance represented by the point 4. This reset is only needed if the magnetoresistance element becomes saturated to the saturation region 12e, and is not needed if the magnetoresistance element becomes saturated to the saturation region 12h. Similarly, if operation on the linear region 12b is desired, then the reset forces the magnetoresistance element to a resistance represented by the point 2. This reset is only needed if the magnetoresistance element becomes saturated to the saturation region 12h, and is not needed if the magnetoresistance element becomes saturated to the saturation region 12e.

In some embodiments, a reset operates in two directions, first forcing the magnetoresistance element to the point 2 then to the point 4 or vice versa. With these arrangements, it will be deterministic as to which linear region 12a or 12b the magnetoresistance element operates on thereafter.

A point 2' is a point near to or on the transition region 12d and a point 4' is a point near to or on the transition region 12f.

The above described increases and decreases of a magnetic field experienced by the magnetoresistance element, which result in transitions about the hysteresis curve 12, are often portrayed in terms of the magnetic field being generally aligned with a maximum response axis of the magnetoresistance element. However, similar transitions can occur when the magnetic field is not aligned with the maximum response axis.

Figure 1A:
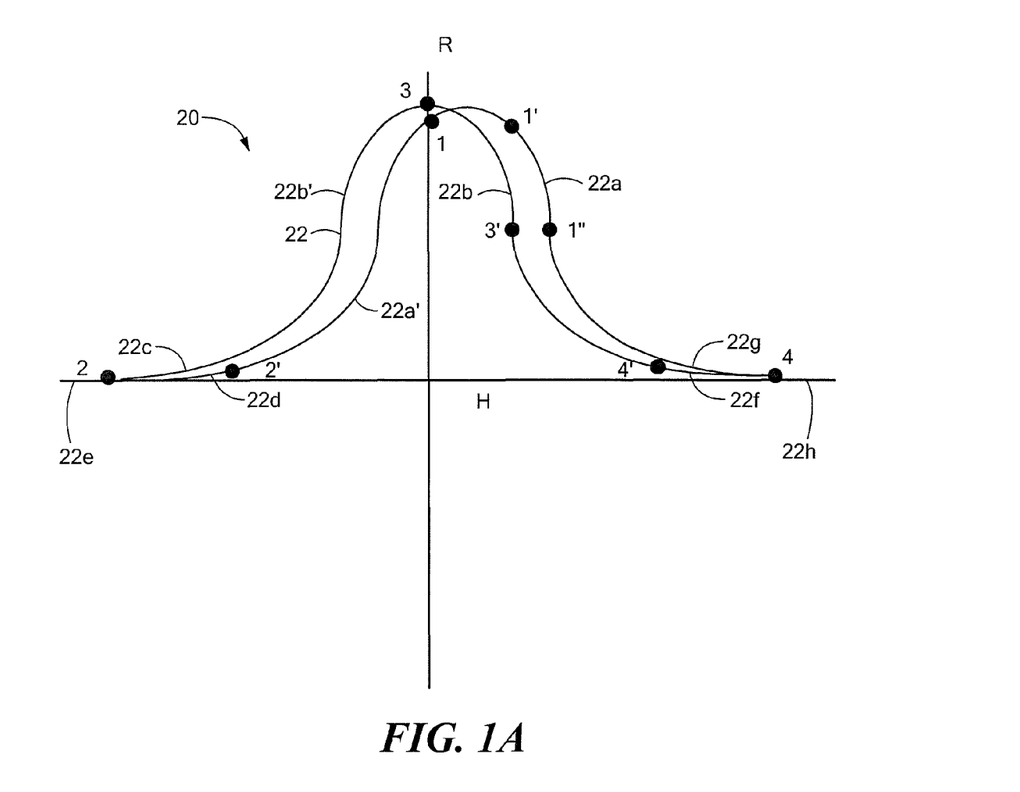
FIG. 1A is a graph showing an exemplary hysteresis characteristic associated with another type of magnetoresistance element.

Referring now to FIG. 1A, in which like points 1, 2, 3, 4, 2', 4' of FIG. 1 are again shown, a graph 20 has a horizontal axis with units of applied magnetic field, or H, which may be provided, for example, in unit of Oersteds, and a vertical axis with a scale in units of resistance, or R, which may be provided, for example, in units of Ohms. A curve 22 is representative of a hysteresis characteristic of some other types of magnetoresistance elements for example, a giant magnetoresistance element.

The curve 22 has relatively flat saturation regions 22e, 22h, in which the magnetoresistance element associated with the curve 22 experiences high magnetic fields, and relatively straight linear regions 22a, 22b separated from the saturation region 22h by transition regions 12f, 12g. It will be recognized that there are other linear regions 22a', 22b' on the curve 22, which are separated by transition regions 22c, 22d from the saturation region 22e. However, in operation, the type of magnetoresistance element represented by the curve 22 is generally biased to one side or the other to operate in either of the linear regions 22a, 22b or in either of the linear regions 22a', 22b'.

When the magnetoresistance element associated with the curve 22 experiences a nominal (or zero) magnetic field, for example, at the crossing of the two axes, the resistance of the magnetoresistance element can be a resistance represented by either point 1 or point 3. If the magnetoresistance element is biased, for example, to the right, the resistance of the magnetoresistance element can be a resistance represented by either point 1' or point 3'. Presuming that the resistance is at the point 1', if the magnetic field increases to the right, the magnetoresistance element will achieve a resistance represented by the point 4. If the magnetic field is decreased thereafter to the left, the magnetoresistance element will again achieve the resistance represented by the point 1'.

If the magnetic field is increased in the other direction (or decreased further for the case when the crossing of the axes is not at zero magnetic field) the magnetoresistance element will achieve a resistance represented by the point 2. If the magnetic field is increased thereafter to the right, the magnetoresistance element will achieve a resistance represented by the point 3', and not by the point 1'. Thus, at a magnetic field represented by the points 1' and 3' (or at other points, e.g., 1, 3), there is an uncertainty as to the magnetic field being experienced by the magnetoresistance element. In particular, two different resistances, those represented by points 1' and 3' (or 1 and 3 ), are both indicative of the same magnetic field.

It will be recognized that if the magnetic field is increased to the right further, the magnetoresistance element will again achieve a resistance represented by the point 4. From the point 4, if the magnetic field is decreased to the left, the magnetoresistance element will achieve a resistance represented by the point 1'.

The discussion above also applies where point 1 is substituted for the point 1' and point 3 is substituted for the point 3'. However, the points 1' and 3' are points to which a magnetoresistance element having the hysteresis characteristic 22 can be biased so as to operate in the linear regions 22a, 22b.

In view of the above discussion, it will be apparent that, if the magnetoresistance element achieves a resistance represented by either the point 2 or the point 4, it is deterministic on which one of the two linear regions 22a or 22b (or 22a', 22b') the magnetoresistance element will thereafter operate. Therefore, as described above, the term "reset" is used herein to describe a forcing of the magnetoresistance element to achieve either the point 2 or the point 4 by application of a reset magnetic field to the magnetoresistance element in one direction or the other.

If operation on the linear region 22a is desired, then the reset forces the magnetoresistance element to the point 4. This reset is only needed if the magnetoresistance element becomes saturated to the saturation region 22e, and is not needed if the magnetoresistance element becomes saturated to the saturation region 22h. Similarly, if operation on the linear region 22b is desired, then the reset forces the magnetoresistance element to the point 2. This reset is only needed if the magnetoresistance element becomes saturated to the saturation region 22h, and is not needed if the magnetoresistance element becomes saturated to the saturation region 22e.

In some embodiments, a reset operates in two directions, first forcing the magnetoresistance element to the point 2 then to the point 4 or vice versa. With these arrangements, it will be deterministic as to which linear region 22a or 22b the magnetoresistance element operates on thereafter.

A point 2' is a point near to or on the transition regions 22d and a point 4' is a point near to or on the transition region 22f.

The curves 12, 22 of FIGS. 1 and 1A, respectively, are representative of hysteresis characteristics of particular types of magnetoresistance elements. It will be appreciated that other types of magnetoresistance elements may have other forms of hysteresis characteristics. However, the concepts described above apply equally well to magnetoresistance elements having those other types of hysteresis characteristics.

Figure 2:
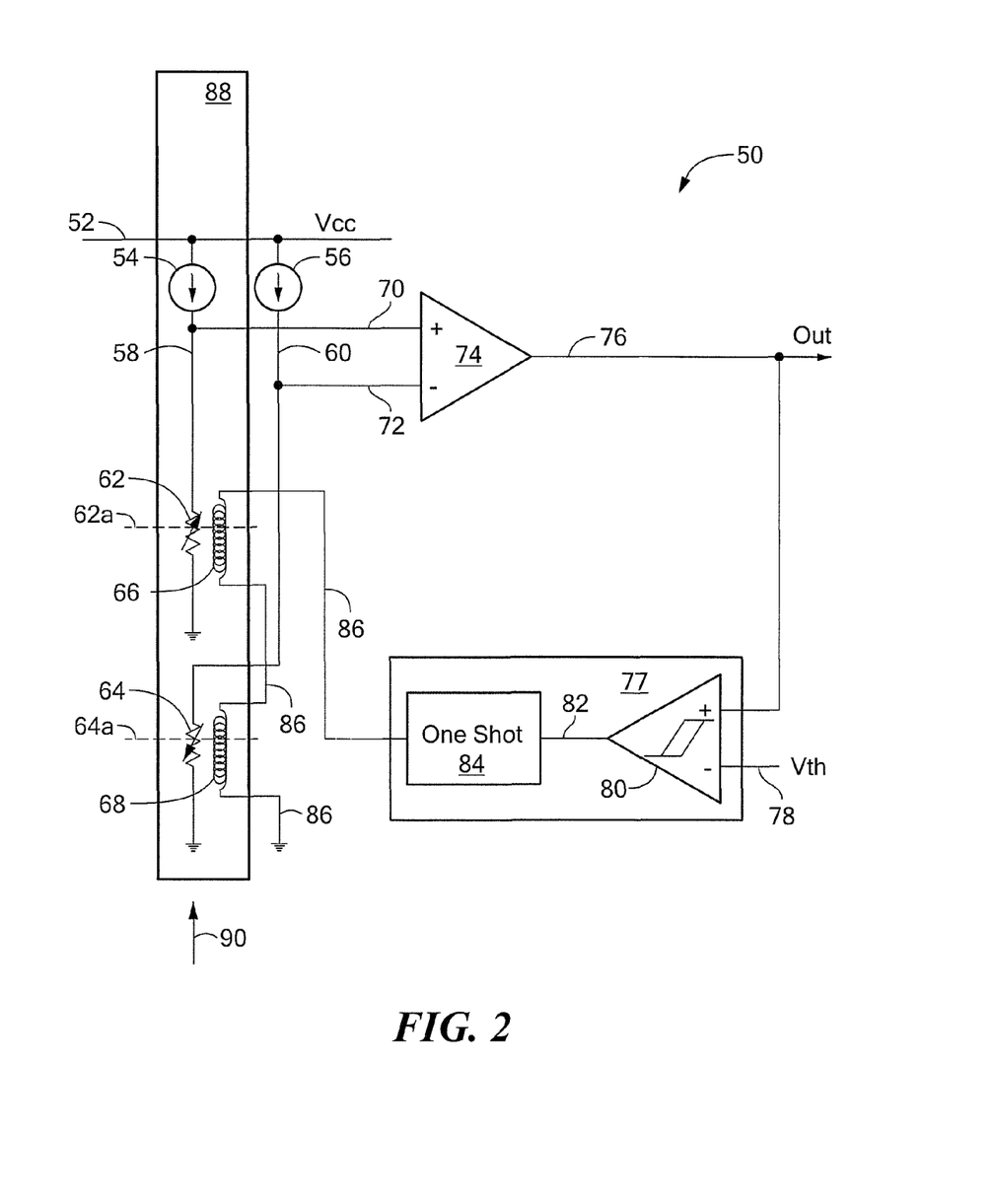
FIG. 2 is a block diagram showing an exemplary sensor, here a current sensor, having a magnetoresistance element, here two magnetoresistance elements, the sensor configured in an open loop arrangement, the sensor having a reset conductor and also having a comparison circuit.

Referring to FIG. 2, an exemplary electronic circuit 50 includes a magnetoresistance element, here two magnetoresistance elements 62, 64, for providing an output signal 76 proportional to a magnetic field. In some embodiments, the circuit 50 is a current sensor and the sensed magnetic field is generated by a current 90 carried by a current-carrying conductor 88. The magnetoresistance elements 62, 64 have maximum response axes 62a, 64a, respectively. The magnetoresistance elements also have a hysteresis characteristic, for example one of the hysteresis characteristics represented by the curves 12, 22 of FIGS. 1 and 1A, respectively. The electronic circuit 50 also includes a reset conductor, here two reset conductors 66, 68, disposed proximate to the magnetoresistance elements 62, 64, respectively. The electronic circuit 50 also includes a comparison circuit 77 coupled to receive the output signal 76, configured to compare the output signal 76 to a threshold signal 78, and configured to generate a reset current 86 carried by the reset conductors 66, 68 in response to the comparison. In response to the reset current 86, the reset conductors 66, 68 are configured to generate respective reset magnetic fields at the magnetoresistance elements 62, 64 to temporarily force the magnetoresistance element 62, 64 to respective saturation regions of the hysteresis characteristic.

In some embodiments, the reset conductors 66, 68 are coils as shown. In other embodiments, the reset conductors 66, 68 are straight conductors passing proximate to, for example, over or under, the magnetoresistance elements 62, 64. The reset conductors 66, 68 can be formed, for example example, on a substrate associated with the magnetoresistance elements 62, 64.

The magnetoresistance element 62 carries a current 58 generated by a current source 54 and the magnetoresistance element 64 carries a current 60 generated by a current source 56.

In the embodiment shown, the two magnetoresistance elements 62, 64 are the same type of magnetoresistance elements but are arranged in opposite directions represented by arrows in opposite directions on the two magnetoresistance elements 62, 64. With this arrangement, in response to the current 90 flowing in one direction, one of the two magnetoresistance elements 62, 64 increases in resistance, and the other magnetoresistance element has the opposite response and decreases in resistance, resulting in a differential signal 70, 72, which can be a differential voltage signal. The differential signal 70, 72 is received by an amplifier 74, which generates the output signal 76.

It will be appreciated that a similar effect can be achieved, namely two magnetoresistance elements that have opposite responses to a magnetic field, by fabricating the two magnetoresistance elements 62, 64 in different ways so as to have different polarities.

In some embodiments, the comparison circuit 77 can include a comparator 80 coupled to receive the output signal 76 and coupled to receive the threshold signal 78. The comparator 80 is configured to generate a comparison signal 82, which has two states, a first state indicative of the output signal 76 being greater than the threshold signal 78 and a second state indicative of the output signal 76 being less than the threshold signal 78.

A monostable multivibrator circuit 84 (also referred to as a one shot circuit) is coupled to receive the comparison signal 82 and to generate the reset current, which is a temporary current. In one particular embodiment, the reset current is about ten to seventy mA, for a period of about 0.1 to one hundred milliseconds. In one particular embodiment, the reset current is about thirty-five mA for a period of about one millisecond.

It will be apparent that, depending upon which transition of the comparison signal 82, low to high or high to low, causes the one shot circuit 84 to trigger, therefore generating the reset signal 86, and also depending upon a value of the threshold signal 78, the reset signal 86 can either be generated at a time when the output signal 76 is greater than the threshold signal 78, at a time when the output signal 76 is less than the threshold signal 78, at a time when the output 76 signal is first greater than the threshold signal 78 and then less then the threshold signal 78, or at a time when the output signal 78 is first less than the threshold signal 78 and then greater than the threshold signal 78. It will be recognized that is many situations, it is advantageous for the reset signal 86 to be generated not when the magnetoresistance elements 62, 64 first reach the saturations regions, for example, 12e, 12h of FIG. 1, of the hysteresis characteristic, but instead when the magnetoresistance elements 62, 64 first reach and then depart from the saturation regions 12e, 12h.

In some embodiments, the electronic circuit 50 can reset only after the magnetoresistance elements 62, 64 achieve one particular condition. For example, the electronic circuit 50 can reset only after a first one of the magnetoresistance elements 62, 64 achieves the saturation region 12h of FIG. 1 and a second one of the magnetoresistance elements 62, 64 achieves the saturation region 12e, i.e., opposite saturation regions. As described above in conjunction with FIGS. 1 and 1A, it may not be necessary to reset the magnetoresistance elements 62, 64 under the opposite condition, i.e., after the first one of the magnetoresistance elements 62, 64 achieves the saturation region 12e of FIG. 1 and the second one of the magnetoresistance elements 62, 64 achieves the saturation region 12h.

As described above, in the embodiment shown, the magnetoresistance elements 62, 64 are arranged in opposite directions and thus respond in opposite directions to the same direction magnetic field. In some embodiments, the reset magnetic field presented by the reset conductors 66, 68 to the magnetoresistance elements 62, 64, respectively, are in the same directions and parallel to the maximum response axes 62a, 64a. However, in some other embodiments, the reset magnetic field presented by the reset conductors 66, 68 to the magnetoresistance elements 62, 64, respectively, are in opposite directions and parallel to the maximum response axes 62a, 64a.

After the above-described particular condition is reached, or rather after this condition is reached and removed, both of the magnetoresistance elements 62, 64 can be reset. The reset magnetic fields can result in the first one of the magnetoresistance elements 62, 64 achieving, for example, the point 2 on the hysteresis curve 12 of FIG. 1 and the second one of the magnetoresistance element 62, 64 achieving, for example, the point 4.

As described above in conjunction with FIGS. 1 and 1A, it will be appreciated that, after the reset signal 86 is applied and then removed, because the magnetoresistance elements 62, 64 are oriented in opposite directions, the two magnetoresistance elements 62, 64 will be operating on different ones of the linear regions (e.g., 12a, 12 of FIG. 1) of a hysteresis characteristic (e.g., 12 of FIG. 1). This outcome is deterministic and merely results in an offset of the output signal 76. The offset can be eliminated by electronic means as will be understood.

In some embodiments, there is no current-carrying conductor 88, and the resulting circuit is used to sense magnetic fields, as would be generated, for example, by passing alternating magnetic domains of a rotating segmented ring magnet.

In some other embodiments, the two magnetoresistance elements 62, 64 can be oriented in the same direction and the current-carrying conductor 88 can pass by each one of the magnetoresistance elements 62, 64 in opposite directions.

In some other embodiments, there are more than two magnetoresistance elements, for example, four magnetoresistance elements in a Wheatstone bridge arrangement. In other embodiments, there is only one magnetoresistance element. In the case of an embodiment having only one magnetoresistance element, it may be desirable to also have a temperature transducer to determine if changes are caused by temperature coefficient of resistance changes, or by a magnetic field. In this case the current sensor 50 may be calibrated at various temperatures and the resistance changes stored in an internal memory bank, for example an EPROM storage cell on an integrated circuit in the sensor.

Figure 3:
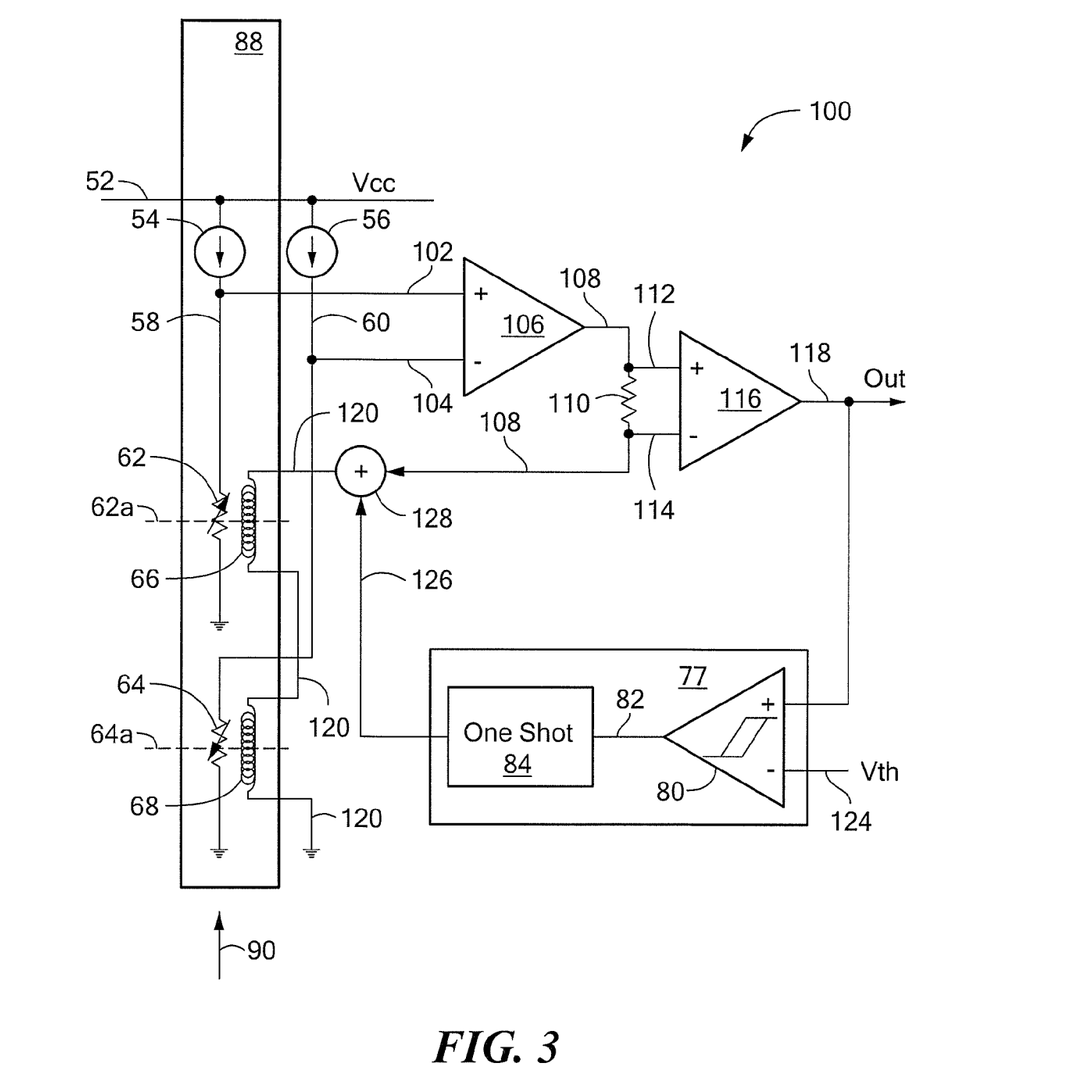
FIG. 3 is a block diagram showing another exemplary sensor, here a current sensor, having a magnetoresistance element, here two magnetoresistance elements, the sensor configured in a closed loop arrangement, the sensor having the reset conductor and the comparison circuit of FIG. 2.

It will be apparent from the discussion below in conjunction with FIG. 3, that the electronic circuit 50 is arranged in an open loop configuration, while an electronic circuit 100 of FIG. 3 is arranged in a closed loop arrangement.

Referring now to FIG. 3, in which like elements of FIG. 2 are shown having like reference designations, the electronic circuit 100 includes a magnetoresistance element, here the two magnetoresistance elements 62, 64, for providing an output signal 118 proportional to a magnetic field. In some embodiments, the circuit 100 is a current sensor and the sensed magnetic field is generated by the current 90 carried by the current-carrying conductor 88. The magnetoresistance elements 62, 64 have maximum response axes 62a, 64a, respectively. The magnetoresistance elements also have a hysteresis characteristic, for example one of the hysteresis characteristics represented by the curves 12, 22 of FIGS. 1 and 1A. The electronic circuit 100 also includes a reset conductor, here the two reset conductors 66, 68, disposed proximate to the magnetoresistance elements 62, 64, respectively. The electronic circuit 100 also includes the comparison circuit 77 coupled to receive the output signal 118, configured to compare the output signal 118 to a threshold signal 124, and configured to generate a reset current 126 carried by the reset conductors 66, 68 in response to the comparison. In response to the reset current 126, the reset conductors 66, 68 are configured to generate respective reset magnetic fields at the magnetoresistance elements 62, 64 to temporarily force the magnetoresistance element 62, 64 to respective saturation regions of the hysteresis characteristic.

As described above in conjunction with FIG. 2, in the embodiment shown, the two magnetoresistance elements 62, 64 are arranged in opposite directions, represented by arrows in different directions on the two magnetoresistance elements 62, 64. With this arrangement, in response to the current 90 flowing in one direction, one of the two magnetoresistance elements 62, 64 increases in resistance, and the other magnetoresistance element decreases in resistance, resulting in a differential signal 102, 104, which can be a differential voltage signal, but which can be unlike the differential signal 70, 72 of FIG. 2 for reasons that will become apparent from discussion below.

The differential signal 102, 104 is received by an amplifier 106, which is configured to generate a closed loop current signal 108. The closed loop current signal 108 passes through a resistor 110, generating a differential signal 112, 114, which is received by another amplifier 116, which is configured to generate the output signal 118.

The closed loop current signal 108 is received by a summation module 128 along with the reset current signal 126. The summation module is configured to generate a summation current signal 120 as a sum of the closed loop current signal 108 and the reset current signal 126.

In operation, without the reset current 126, the summation current signal 120 includes only the closed loop current signal 108, in which case, the reset conductors 66, 68 operate to provide magnetic fields to the magnetoresistance elements 62, 64 that oppose the magnetic field generated by the current 90 passing through the current-carrying conductor 88. With this arrangement, the magnetic field sensing elements 62, 64 tend to experience a nearly zero magnetic field even in the presence of the magnetic field generated by the current-carrying conductor. Therefore, unless the closed loop current signal 108 saturates, or unless the closed loop current signal 108 has too slow a response time in response to a large transient magnetic field, the magnetic field sensing elements 62, 64 will maintain operation on known linear regions of an associated hysteresis characteristic.

If, however, the closed loop current signal 108 saturates, or if the closed loop current signal 108 has too slow a response time in response to a large transient magnetic field, then that particular condition can be sensed by the comparison circuit 77, resulting in the reset current signal 128, which can reset the magnetic field sensing elements 62, 64 to thereafter operate on known linear regions of the hysteresis characteristic.

Figure 4:
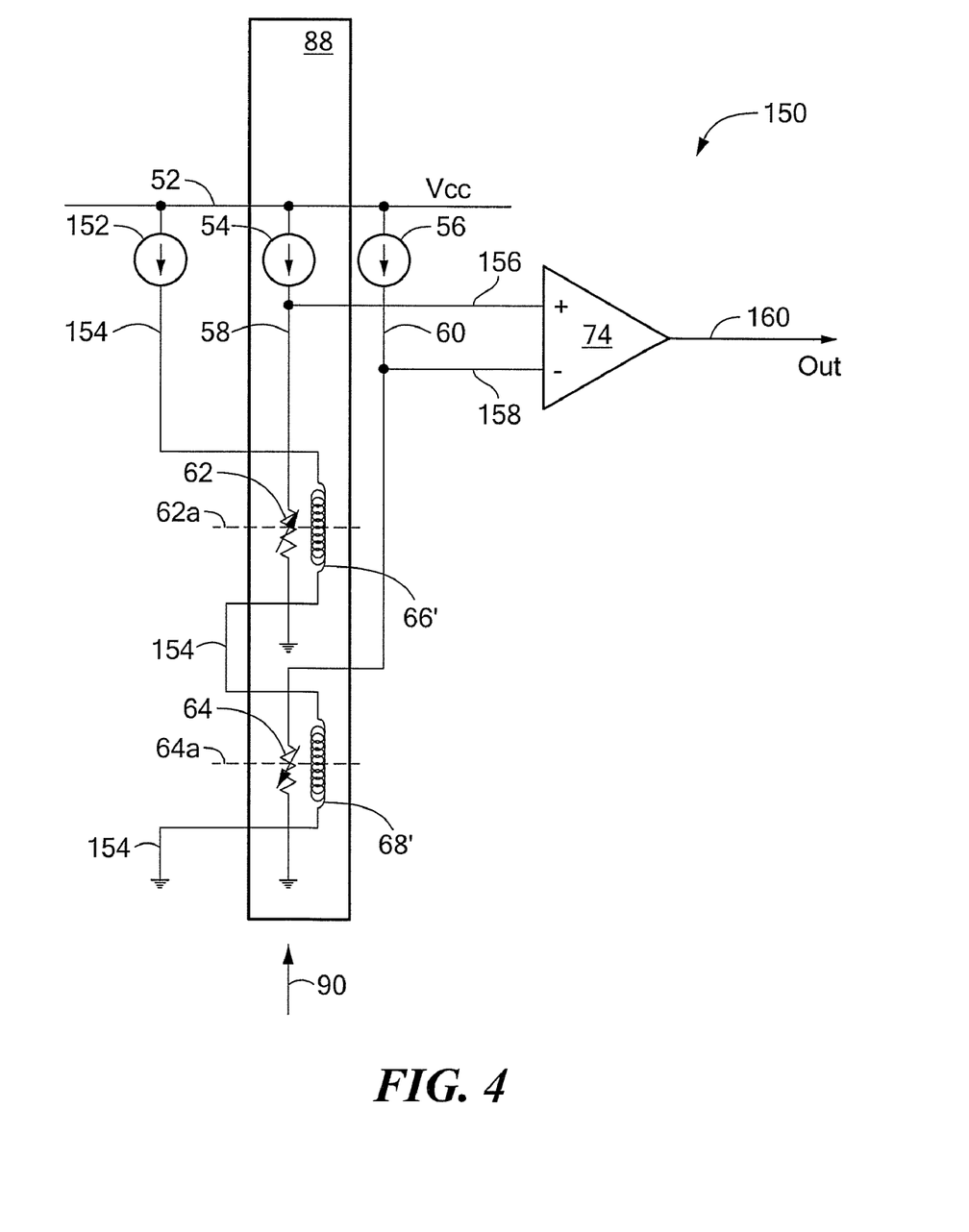
FIG. 4 is a block diagram showing another exemplary sensor, here a current sensor, having a magnetoresistance element, here two magnetoresistance elements, the sensor configured in an open loop arrangement, the sensor having a bias magnetic field generating module.

Referring now to FIG. 4, in which like elements of FIG. 2 are shown having like reference designations, an electronic circuit 150 includes a magnetoresistance element, here the two magnetoresistance elements 62, 64, for providing an output signal 160 proportional to a magnetic field. In some embodiments, the electronic circuit 150 is a current sensor and the sensed magnetic field is generated by the current 90 carried by the current-carrying conductor 88. The magnetoresistance elements 62, 64 have maximum response axes 62*a*, 64*a*, respectively. The magnetoresistance elements 62, 64 also have a hysteresis characteristic, for example one of the hysteresis characteristics represented by the curves 12, 22 of FIGS. 1 and 1A.

The electronic circuit 150 also includes a bias magnetic field generating module, wherein the bias magnetic field generating module is configured to continuously generate a bias magnetic field at the magnetic field sensing elements 62, 64 to continually force the magnetic field sensing elements 62, 64 to respective transition regions of the hysteresis characteristic in the absence of any other magnetic field.

The bias magnetic field generating module includes a bias conductor, here two bias conductors 66', 68', disposed proximate to the magnetic field sensing elements 62, 64, respectively. The two bias conductors 66', 68' can be the same as or similar to the reset conductors 66, 68 of FIG. 2. However, the bias conductors 66', 68' are used to generate a bias magnetic field to offset the magnetic field experienced by the magnetic field sensing elements 62, 64, rather than to reset the magnetic field sensing elements 62, 64.

It will be appreciated that the above-described application of the reset magnetic fields at the magnetoresistance elements 62, 64 is temporary and results in the magnetoresistance elements 62, 64 being forced all the way into a saturation region, for example 12*e* or 12*h* of FIG. 1 of a hysteresis characteristic. In contrast, application of the bias magnetic fields at the magnetoresistance elements 62, 64 is continuous and results in the magnetoresistance elements 62, 64 being forced only at or near one of the transition regions, for example 12*d* or 12*f* of FIG. 1.

The bias magnetic field generating module also includes a current source 152 coupled to provide a bias current 154 carried by the bias conductors 66', 68'. The bias conductors 66', 68' are configured to generate magnetic fields in proximity to the magnetic field sensing elements 62, 64 in a direction opposite to a magnetic field generated by the current 90 being carried by the current-carrying conductor 88.

In some particular arrangements, a first one of the two magnetic field sensing elements 62, 64 is essentially biased, for example, to operate (in the absence of other magnetic fields) at the point 2' of FIG. 1, and the a second one of the two magnetic field sensing elements 62, 64 is essentially biased, for example, to operate at the point 4' of FIG. 1, when the current 90 is zero. As described above, the points 2' and 4' are at or near to the transition regions 12*d*, 12*f*, respectively. With this arrangement, at increasing magnetic fields generated by increasing currents 90, the first one of the two magnetic field sensing elements 62, 64 operates at points moving to the right of the point 2' and the second one of the two magnetic field sensing elements 62, 64 operates at points moving to the left of the point 4'.

The electronic circuit 150 provides for operation over a wider range of current than the electronic circuits 50, 100 of FIGS. 2 or 3. However, it will be apparent that the electronic circuit 150 is configured to sense the current 90 only when flowing in one direction.

In some embodiments, one of the magnetoresistance elements 62, 64 and an associated one of one of the bias conductors 66,' 68' are rotated 180 degrees. In these embodiments, unlike arrangements described above, the magnetoresistance elements 62, 64 have the same direction of response to the current 90. And, like the arrangement described above, both of the magnetoresistance elements 62, 64 can be biased in the opposite directions, for example, one of the magnetoresistance elements 62, 64 can be biased to have a resistance represented by the point 2' of FIG. 1, and the other one if the two magnetoresistance elements 62, 64 can be biased to have a resistance represented by the point 4' of FIG. 1. It will be apparent that the arrangement thus described is configured to sense the current 90 when flowing in either direction. When the current 90 flows in one direction, the points 2' and 4' will move to the right, causing a change in the differential voltage 156, 156 that they represent, since the resistance represented by the point 4' will move little when shifted to the right. When the current 90 flows in the other direction, the points 2' and 4' will move to the left, causing an opposite change in the differential voltage 156, 156 that they represent, since the resistance represented by the point 2' will move little when shifted to the left.

Figure 5:
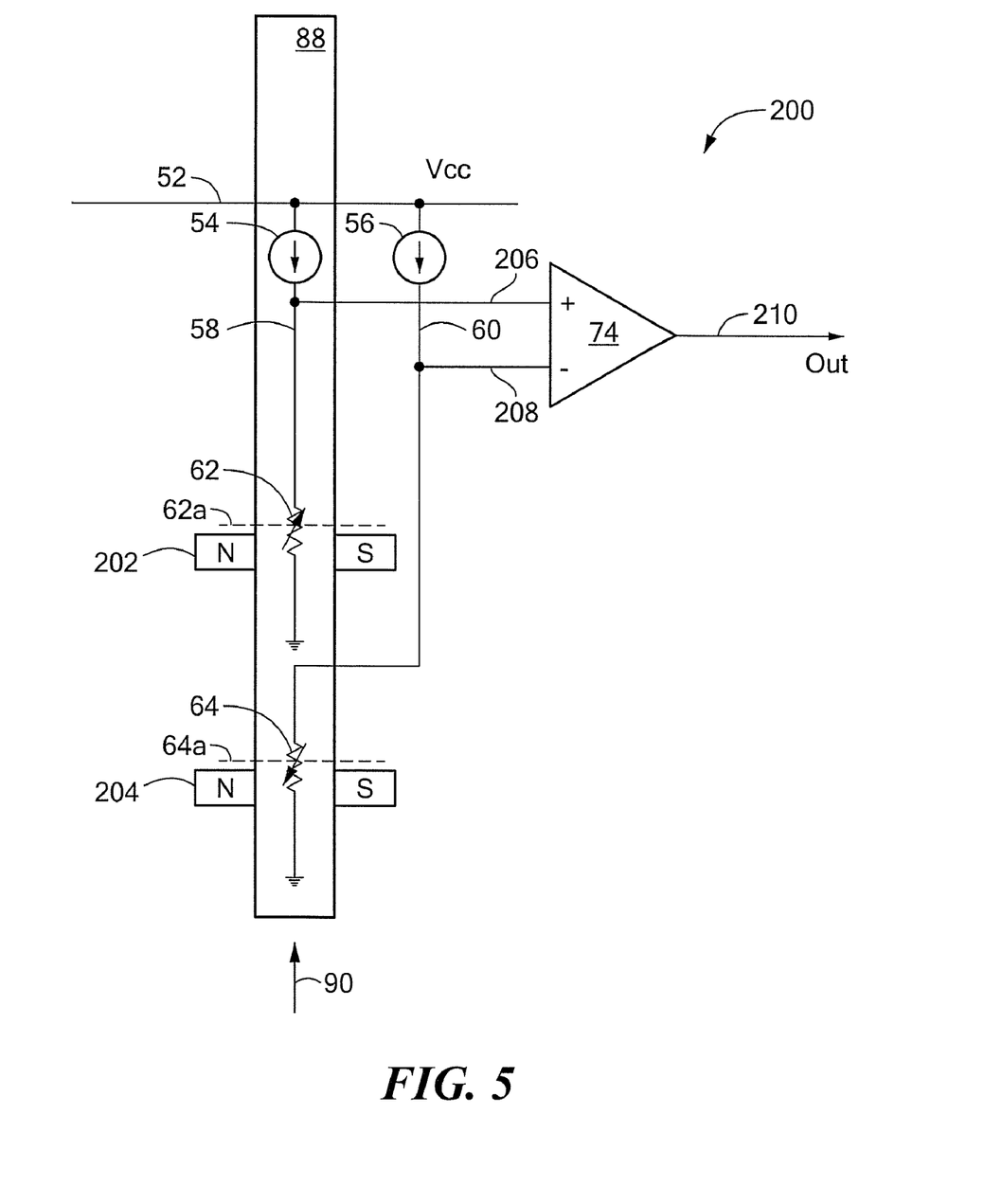
FIG. 5 is a block diagram showing another exemplary sensor, here a current sensor, having a magnetoresistance element, here two magnetoresistance elements, the sensor configured in an open loop arrangement, the sensor having another bias magnetic field generating module.

Referring now to FIG. 5, in which like elements of FIG. 2 are shown having like reference designations, an electronic circuit 200 includes a magnetoresistance element, here the two magnetoresistance elements 62, 64, for providing an output signal 210 proportional to a magnetic field. In some embodiments, the electronic circuit 200 is a current sensor and the sensed magnetic field is generated by the current 90 carried by the current-carrying conductor 88. The magnetoresistance elements 62, 64 have maximum response axes 62*a*, 64*a*, respectively. The magnetoresistance elements 62, 64 also have a hysteresis characteristic, for example one of the hysteresis characteristics represented by the curves 12, 22 of FIGS. 1 and 1A, respectively.

The electronic circuit 200 also includes a bias magnetic field generating module, wherein the bias magnetic field generating module is configured to continuously generate a bias magnetic field at the magnetoresistance elements 62, 64 to continually force the magnetoresistance elements 62, 64 to respective transition regions of the hysteresis characteristic in the absence of any other magnetic field.

The bias magnetic field generating module includes a magnet, here two magnets 202, 204 disposed proximate to the magnetoresistance elements 62, 64, respectively. The magnets 202, 204, like the bias conductors 66', 68' of FIG. 4, are used to offset the magnetic field nominally experienced by the magnetic field sensing elements 62, 64.

The magnets 202, 204 are configured to generate magnetic fields in proximity to the magnetic field sensing elements 62, 64 in a direction opposite to a magnetic field generated by the current 90 being carried by the current-carrying conductor 88.

In some particular arrangements, a first one of the two magnetic field sensing elements 62, 64 is essentially biased, for example, to nominally operate at the point 2' of FIG. 1, and the a second one of the two magnetic field sensing elements 62, 64 is essentially biased, for example, to operate at the point 4' of FIG. 1, when the current 90 is zero. As described above, the points 2' and 4' are at or near to the transition regions 12*d*, 12*f*, respectively. With this arrangement, at increasing magnetic fields generated by increasing currents 90, the first one of the two magnetic field sensing elements 62, 64 operates at points moving to the right of the point 2' and the second one of the two magnetic field sensing elements 62, 64 operates at points moving to the left of the point 4'.

The electronic circuit 200, like the electronic circuit 150 of FIG. 4, provides for operation over a wider range of current than the electronic circuits 50, 100 of FIGS. 2 or 3. However, the electronic circuit 200 is configured to sense the current 90 only when flowing in one direction.

Figure 6:
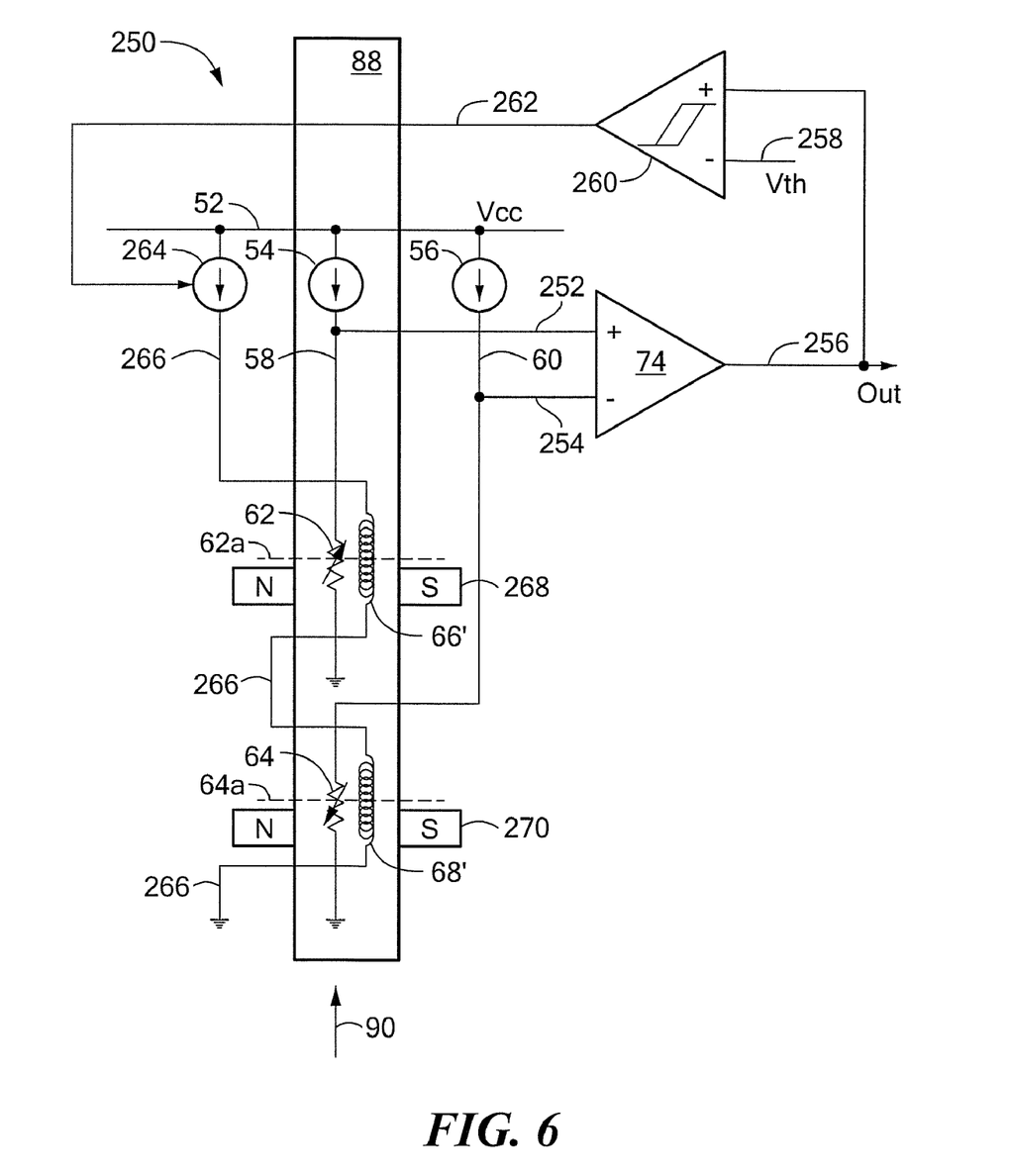
FIG. 6 is a block diagram showing another exemplary sensor, here a current sensor, having a magnetoresistance element, here two magnetoresistance elements, the sensor configured in an open loop arrangement, the sensor having a first bias magnetic field generating module the same as or similar to the bias magnetic field generating module of FIG. 5, and also having a second bias magnetic field generating module.

Referring now to FIG. 6, in which like elements of FIG. 2 are shown having like reference designations, an electronic circuit 250 includes a magnetoresistance element, here the two magnetoresistance elements 62, 64, for providing an output signal 256 proportional to a magnetic field. In some embodiments, the electronic circuit 250 is a current sensor and the sensed magnetic field is generated by the current 90 carried by the current-carrying conductor 88. The magnetoresistance elements 62, 64 have maximum response axes 62a, 64a, respectively. The magnetoresistance elements 62, 64 also have a hysteresis characteristic, for example one of the hysteresis characteristics represented by the curves 12, 22 of FIGS. 1 and 1A, respectively.

The electronic circuit 250 also includes a first bias magnetic field generating module, wherein the first bias magnetic field generating module is configured to continuously generate a first bias magnetic field at the magnetoresistance elements 62, 64 to continually force the magnetoresistance elements 62, 64 to respective transition regions of the hysteresis characteristic in the absence of any other magnetic field.

The first bias magnetic field generating module includes a magnet, here two magnets 268, 270 disposed proximate to the magnetoresistance elements 62, 64, respectively. The magnets 268, 270, like the bias conductors 66', 68' of FIG. 4, are used to offset the magnetic field nominally experienced by the magnetic field sensing elements 62, 64.

The magnets 268, 270 are configured to generate magnetic fields in proximity to the magnetic field sensing elements 62, 64 in a direction opposite to a magnetic field generated by the current 90 being carried by the current-carrying conductor 88.

In some particular arrangements, a first one of the two magnetic field sensing elements 62, 64 is essentially biased, for example, to nominally operate at the point 2' of FIG. 1, and the a second one of the two magnetic field sensing elements 62, 64 is essentially biased, for example, to operate at the point 4' of FIG. 1, when the current 90 is zero. As described above, the points 2' and 4' are at or near to the transition regions 12d, 12f, respectively. With this arrangement, at increasing magnetic fields generated by increasing currents 90, the first one of the two magnetic field sensing elements 62, 64 operates at points moving to the right of the point 2' and the second one of the two magnetic field sensing elements 62, 64 operates at points moving to the left of the point 4'.

The electronic circuit 250, like the electronic circuit 150 of FIG. 4, provides for operation over a wider range of current than the electronic circuits 50, 100 of FIGS. 2 or 3. However, the electronic circuit 250 is configured to sense the current 90 only when flowing in one direction However, in a similar way to that as described above in conjunction with FIG. 4, in some embodiments, one of the magnetoresistance elements 62, 64 and an associated one of one of the bias conductors 66,' 68' and also an associated one of the magnets 268, 270 are rotated 180 degrees, in which case the electronic circuit 250 can sense the current 90 flowing in two directions for reasons described above in conjunction with FIG. 4.

Unlike the electronic circuit 200 of FIG. 5, the electronic circuit 250 further includes a second bias magnetic field generating module, wherein the second bias magnetic field generating module is configured to continuously generate a second bias magnetic field at the magnetoresistance elements 62, 64 in response to a predetermined deviation of the output signal 256.

The second bias magnetic field generating module includes a bias conductor, here the two bias conductors 66', 68', disposed proximate to the magnetic field sensing elements 62, 64, respectively. The two bias conductors 66', 68' can be the same as or similar to the reset conductors 66, 68 of FIG. 2.

The second bias magnetic field generating module also includes a current source 264 coupled to provide a bias current 266 carried by the bias conductors 66', 68'. The bias conductors 66', 68' are configured to generate magnetic fields in proximity to the magnetoresistance elements 62, 64 in a direction opposite to a magnetic field generated by the current 90 being carried by the current-carrying conductor 88.

The second bias magnetic field generating module further includes a comparator 260 coupled to receive the output signal 256, coupled to receive a threshold signal 258, and configured to generate a comparison signal 262 coupled to the current source 264.

In operation, when the output signal 256 exceeds the threshold signal 258, the comparison signal 262 changes state, therefore turning on the current source 264 to provide the bias current 266. In other words, when the electronic circuit 250 senses the current 90 exceeding a predetermined threshold, the electronic circuit 250 generates a second bias magnetic field with the bias conductors 66', 68', forcing operation of the magnetoresistance elements 62, 64 away from respective saturation regions, therefore extending the sensing range of the electronic circuit 250.

Only when the output signal 256 falls low enough (sensed via hysteresis of the comparator 260) does the comparison signal 262 again change state causing the current source 264 to turn off the bias current 266.

Figure 7:
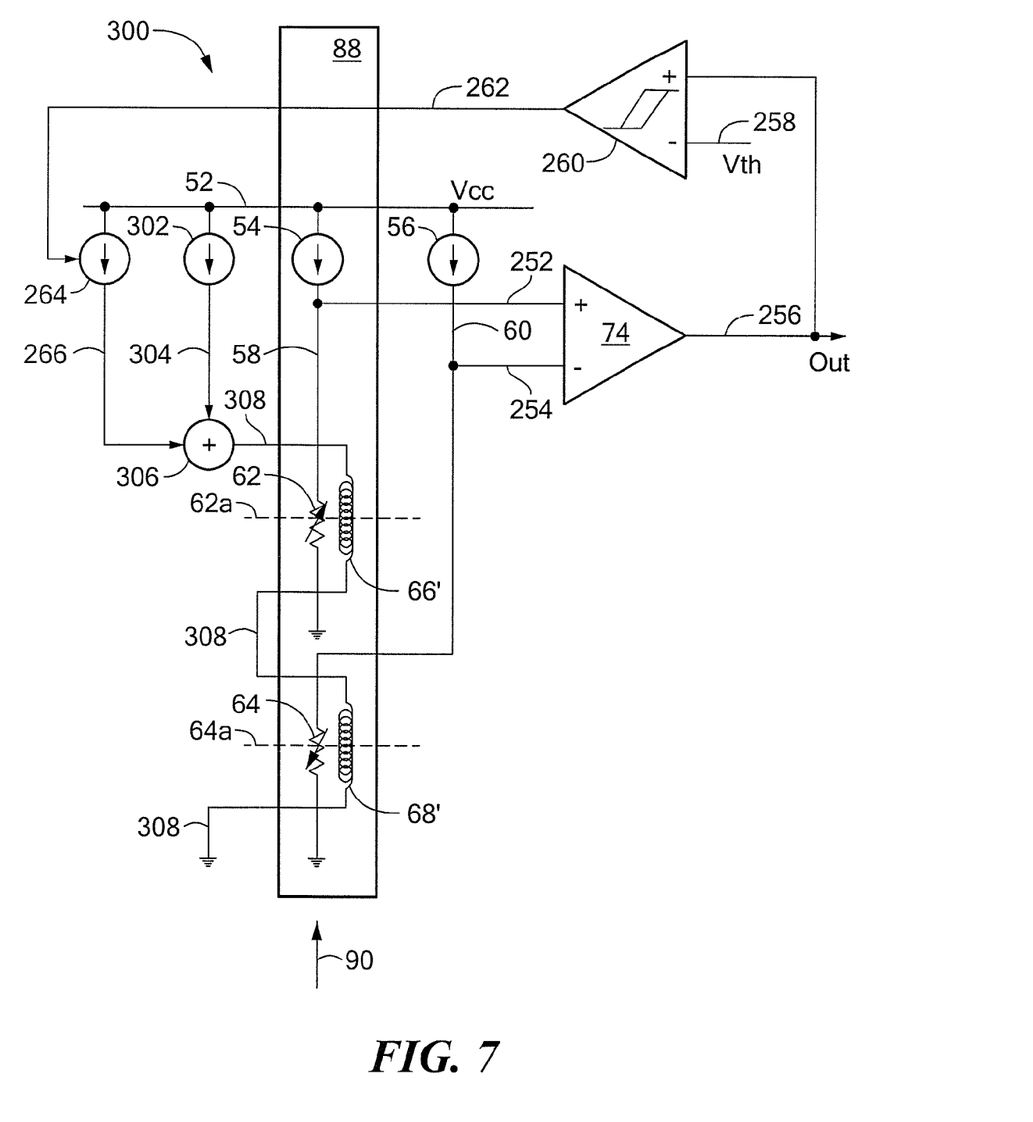
FIG. 7 is a block diagram showing another exemplary sensor, here a current sensor, having a magnetoresistance element, here two magnetoresistance elements, the sensor configured in an open loop arrangement, the sensor having a first bias magnetic field generating module like the bias magnetic field generating module of FIG. 4, and also having a second bias magnetic field generating module the same as or similar to the second bias magnetic field generating module of FIG. 6.

Referring now to FIG. 7, in which like elements of FIG. 2 are shown having like reference designations, an electronic circuit 300 is similar to the electronic circuit 250 of FIG. 6. However, in the electronic circuit 300, the first bias magnetic field is not generated by magnets 268, 270 of FIG. 6, but instead by a bias current 304 generated by a current source 302 and carried by the bias conductors 66', 68'. The bias current 304 is combined with the bias current 266 to provide the bias current 308, which is the full current carried by the bias conductors 66', 68'.

Operation of the electronic circuit 300 is similar to operation of the circuit 250 of FIG. 6 and is not described here again. While current sensors using magnetoresistance elements are described as examples above, it will be appreciated that the above circuits and techniques can also be used with external magnetic field sensors and also with electrical signal isolators.

All references cited herein are hereby incorporated herein by reference in their entirety. Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:
1. An electronic circuit, comprising:
a magnetoresistance element for providing an output signal proportional to a magnetic field, wherein the magnetoresistance element has a maximum response axis, and wherein the magnetoresistance element has a hysteresis characteristic;
a reset conductor disposed proximate to the magnetoresistance element; and
a comparison circuit coupled to receive the output signal, configured to compare the output signal to a threshold signal and configured to generate a reset current carried by the reset conductor in response to the comparison, wherein, in response to the reset current, the reset conductor is configured to generate a reset magnetic field at the magnetoresistance element to temporarily force the magnetoresistance element to a saturation region of the hysteresis characteristic.

2. The electronic circuit of claim 1, wherein the magnetoresistance element comprises a giant magnetoresistance element.

3. The electronic circuit of claim 1, wherein the magnetoresistance element comprises two magnetoresistance elements.

4. The electronic circuit of claim 3, wherein the two magnetoresistance elements as arranged in the electronic circuit have opposite responses to a magnetic field.

5. The electronic circuit of claim 3, wherein the reset magnetic field is generated so as to temporarily force one of the two magnetoresistance elements to a highest resistance and the other one of the two magnetoresistance elements to a lowest resistance.

6. The electronic circuit of claim 3, wherein the reset magnetic field is generated so as to temporarily force both of the two magnetoresistance elements to a highest resistance or to a lowest resistance.

7. The electronic circuit of claim 1, further comprising a current-carrying conductor disposed proximate to the magnetoresistance element, wherein the output signal is proportional to a sensed current magnetic field generated by a current carried by the current-carrying conductor, wherein the electronic circuit is configured as a current sensor.

8. The electronic circuit of claim 1, wherein the reset conductor comprises a coil.

9. The electronic circuit of claim 1, wherein the comparison circuit comprises:
   a comparator coupled to receive the output signal, coupled to receive the threshold signal, and configured to generate a comparison signal; and
   a monostable multivibrator coupled to receive the comparison signal and configured to generate the reset current.

10. The electronic circuit of claim 1, further comprising a bias magnetic field generating module, wherein the bias magnetic field generating module is configured to continuously generate a bias magnetic field at the magnetoresistance element to continually force the magnetoresistance element to a transition region of the hysteresis characteristic in the absence of any other magnetic field.

11. The electronic circuit of claim 10, wherein the bias magnetic field generating module comprises a permanent magnet disposed proximate to the magnetoresistance element.

12. The electronic circuit of claim 10, wherein the bias magnetic field generating module comprises:
   a current source configured to generate a bias current; and
   a bias conductor coupled to carry the bias current and disposed proximate to the magnetoresistance element.

13. The electronic circuit of claim 1, wherein the hysteresis characteristic is a function of resistance versus an applied magnetic field and a graph of the hysteresis characteristic has two linear regions coupled by two saturation regions.

14. The electronic circuit of claim 1, wherein the hysteresis characteristic is a function of resistance versus an applied magnetic field and a graph of the hysteresis characteristic has a shape comprising two overlapping curves.

15. An electronic circuit, comprising:
   a magnetoresistance element for providing an output signal proportional to a magnetic field, wherein the magnetoresistance element has a maximum response axis, and wherein the magnetoresistance element has a hysteresis characteristic;
   a first bias magnetic field generating module; and
   a first bias magnetic field generated by the first bias magnetic field generating module, the first bias magnetic field having a magnetic field strength and a direction at the magnetoresistance element selected to continually force the magnetoresistance element to a transition region of the hysteresis characteristic in the absence of any other magnetic field.

16. The electronic circuit of claim 15, wherein the first bias magnetic field generating module comprises a permanent magnet disposed proximate to the magnetoresistance element.

17. The electronic circuit of claim 15, wherein the first bias magnetic field generating module comprises:
   a current source configured to generate a bias current; and
   a bias conductor coupled to carry the bias current and disposed proximate to the magnetoresistance element.

18. The electronic circuit of claim 15, further comprising a second bias magnetic field generating module, wherein the second bias magnetic field generating module is configured to continuously generate a second bias magnetic field at the magnetoresistance element in response to a predetermined deviation of the output signal.

19. The electronic circuit of claim 15, wherein the magnetoresistance element comprises a giant magnetoresistance element.

20. The electronic circuit of claim 15, wherein the magnetoresistance element comprises two magnetoresistance elements.

21. The electronic circuit of claim 20, wherein the two magnetoresistance elements as arranged in the electronic circuit have opposite responses to a magnetic field.

22. The electronic circuit of claim 15, further comprising a current-carrying conductor disposed proximate to the magnetoresistance element, wherein the output signal is proportional to a sensed current magnetic field generated by a current carried by the current-carrying conductor, wherein the electronic circuit is configured as a current sensor.

23. The electronic circuit of claim 15, wherein the hysteresis characteristic is a function of resistance versus an applied magnetic field and a graph of the hysteresis characteristic two linear regions coupled by two saturation regions.

24. The electronic circuit of claim 15, wherein the hysteresis characteristic is a function of resistance versus an applied magnetic field and a graph of the hysteresis characteristic has a shape comprising two overlapping curves.

* * * * *

UNITED STATES PATENT AND TRADEMARK OFFICE
CERTIFICATE OF CORRECTION

| | | |
|---|---|---|
| PATENT NO. | : 7,973,527 B2 | Page 1 of 1 |
| APPLICATION NO. | : 12/183541 | |
| DATED | : July 5, 2011 | |
| INVENTOR(S) | : William P. Taylor et al. | |

It is certified that error appears in the above-identified patent and that said Letters Patent is hereby corrected as shown below:

Column 4, line 65 delete "is it" and replace with --it is--.

Column 6, line 16 delete "unit" and replace with --units--.

Column 7, line 29 delete "regions" and replace with --region--.

Column 7, line 46 delete "elements also" and replace with --elements 62, 64 also--.

Column 7, line 59 delete "element" and replace with --elements--.

Column 7, line 65 delete "for example example" and replace with --for example--.

Column 8, line 50 delete "is" and replace with --in--.

Column 9, line 22 delete "element" and replace with --elements--.

Column 10, line 15 delete "element" and replace with --elements--.

Column 13, line 30 delete the word "a".

Column 13, lines 47 delete "one of one of" and replace with --one of--.

Column 16, line 49 delete "characteristic two" and replace with --characteristic has two--.

Signed and Sealed this
Third Day of April, 2012

David J. Kappos
*Director of the United States Patent and Trademark Office*